US012765118B2

(12) United States Patent
Roizin et al.

(10) Patent No.: US 12,765,118 B2
(45) Date of Patent: Oct. 13, 2026

(54) ROBUST NEAR INFRARED SENSING DEVICE

(71) Applicant: Tower Semiconductor Ltd., Migdal Haemek (IL)

(72) Inventors: Yakov Roizin, Afula (IL); Pikhay Evgeny, Haifa (IL); Niv Mizrahi, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 162 days.

(21) Appl. No.: 18/762,547

(22) Filed: Jul. 2, 2024

(65) Prior Publication Data

US 2026/0013267 A1 Jan. 8, 2026

(51) Int. Cl.

| | |
|---|---|
| ***H10F 30/00*** | (2025.01) |
| ***H10F 30/223*** | (2025.01) |
| ***H10F 77/00*** | (2025.01) |

(52) U.S. Cl.

CPC ......... *H10F 77/953* (2025.01); *H10F 30/223* (2025.01)

(58) Field of Classification Search

CPC .......... G01J 3/0256; G01J 3/0262; G01J 3/42; H10F 39/107; H10F 39/151; H10F 39/1515; H10F 39/157

See application file for complete search history.

(56) References Cited

U.S. PATENT DOCUMENTS

| | | | |
|---|---|---|---|
| 6,025,585 A | 2/2000 | Holla | |
| 7,566,875 B2 | 7/2009 | Starikov | |
| 11,041,968 B2 | 6/2021 | Danielsson | |
| 11,329,239 B2 | 5/2022 | Zhu | |
| 2009/0297095 A1* | 12/2009 | Matsuoka | B29D 11/00663 264/1.28 |
| 2017/0323982 A1* | 11/2017 | Scarpulla | H10D 8/60 |
| 2019/0378681 A1* | 12/2019 | Stejskal | H01J 37/20 |

* cited by examiner

*Primary Examiner* — Dani Fox
(74) *Attorney, Agent, or Firm* — Reches Patents

(57) ABSTRACT

A robust near infrared sensing device and method for operating of robust near infrared device, the method includes (i) exposing a first side edge of the device to near infrared (NIR) radiation; (ii) detecting by a NIR PIN diode (NPD), the NIR radiation, while operating at a fully depletion mode, (iii) collecting, by guard PIN diodes positioned at different sides of the NPD and while operating in the fully depletion mode, electron-hole pairs generated by unwanted radiation from any side of different sides of the near infrared PIN diode, and preventing these electron-hole pairs from any side of NPD to reach the NPD.

20 Claims, 10 Drawing Sheets

200

ROBUST NEAR INFRARED SENSING DEVICE

BACKGROUND OF THE INVENTION

Near infrared radiation refers to radiation between 800 to 2500 nanometer.

There are various applications that require sensing near infrared radiation-such as biological applications for evaluating cells-especially those that detect near infrared fluorescence emitted from fluorescently label proteins of interest.

Using a semiconductor sensor that is preceded by a separate narrow band filter is costly and area consuming.

In addition—the near infrared radiation to be detected is usually accompanied by visible light and near infrared radiation that introduce significant noise.

There is a growing need to provide a reliable and compact near infrared spectrometry device.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
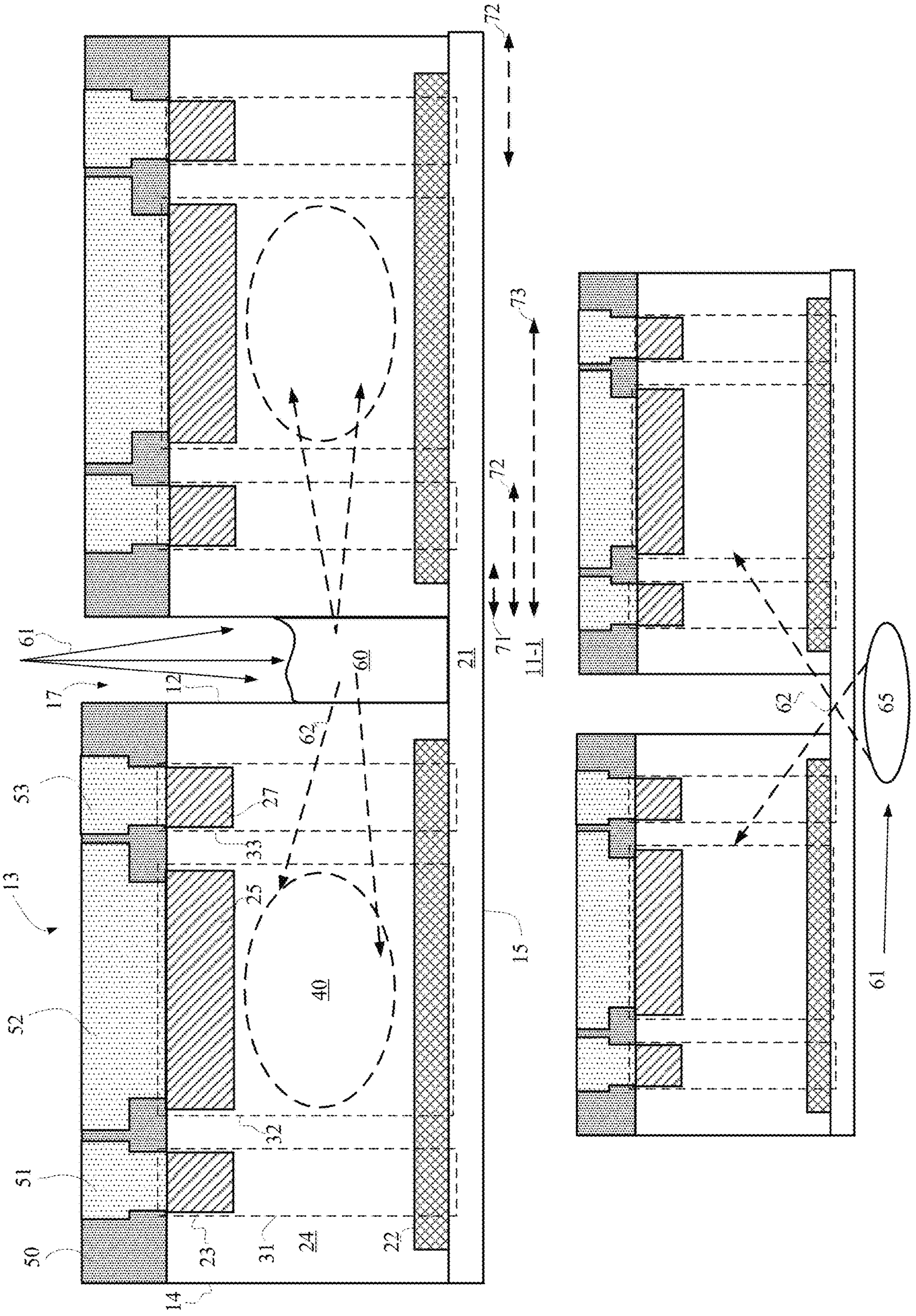
FIG. 1 illustrates an example of a cross section of a robust near infrared sensing device.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

There is provided a robust near infrared sensing device. The robustness refers to the immunity to unwanted radiation that includes ultraviolet radiation and visible light. The radiation is unwanted in the sense that it differs from near infrared radiation and may introduce noise or otherwise reduce the accuracy of measurement of the near infrared device.

According to an embodiment, the robust near infrared sensing device includes:

a. A near infrared PIN diode that is located at a lateral position that corresponds to an absorption depth of a near infrared wavelength. The near infrared PIN diode, once operated in a fully depletion mode, is configured to collect electron-hole pairs generated by near infrared radiation of the near infrared wavelength that passes through a first side edge of the robust near infrared sensing device. The near infrared radiation of the near infrared wavelength has an absorption depth that corresponds to a lateral position of the near infrared PIN diode.

b. A first guard PIN diode that is located (at least has its distal edge located) at a first lateral distance from the first side edge, the first lateral distance exceeds an absorption depth of a first unwanted radiation that enters through the first side edge. Once operated in the fully depletion mode, the first guard PIN diode is configured to collect first electron-hole pairs generated by the first unwanted radiation, and to prevent the first electron-hole pairs to reach the near infrared PIN diode; wherein the first unwanted radiation is at least one of first visible light radiation and first ultraviolet radiation.

c. A second guard PIN diode that is located (at least has its distal edge located) at a second lateral distance from a second side edge of the robust near infrared sensing device. The second lateral distance exceeds an absorption depth of a second unwanted radiation that enters through the second side edge. Once operated in the fully depletion mode, the second guard PIN diode is configured to collect the second electron-hole pairs generated by the second unwanted radiation, and to prevent the second electron-hole pairs from reaching the near infrared PIN diode. The second unwanted radiation is at least one of second visible light radiation and second ultraviolet radiation.

According to an embodiment, the first side edge is an inner side edge that corresponds to a cavity formed within the robust near infrared sensing device. According to an embodiment, the second side edge is an exterior side edge of the robust near infrared sensing device.

According to an embodiment, (i) the first guard PIN diode surrounds the cavity, (ii) the near infrared PIN diode surrounds the first guard PIN diode, and (iii) the second guard PIN diode surrounds the near infrared PIN diode.

According to an embodiment, the first guard PIN diode, the near infrared PIN diode and the second guard PIN diode are annular.

According to an embodiment, one or more dimensions (a dimension may include—width, length, depth) of the robust near infrared sensing device are in an order of an absorption length of the first unwanted radiation.

According to an embodiment, the robust near infrared sensing device includes an unwanted radiation shield configured to block visible radiation and ultraviolet radiation from reaching the near infrared PIN diode from a top and bottom of the robust near infrared sensing device.

According to an embodiment, the robust near infrared sensing device includes a continuous metal contact at a bottom of the robust near infrared sensing device.

According to an embodiment, the robust near infrared sensing device includes contacts for receiving biasing signals for operating the near infrared PIN diode, the first guard PIN diode and the second guard PIN diode in the fully depletion mode.

According to an embodiment, the robust near infrared sensing device includes a biasing circuit that is in electrical communication with the contacts and is configured to provide biasing signals for operating the near infrared PIN diode, the first guard PIN diode and the second guard PIN diode in the fully depletion mode.

According to an embodiment, the near infrared PIN diode, the first guard PIN diode and the second guard PIN diode includes Float Zone silicon.

According to an embodiment, the near infrared PIN diode, the first guard PIN diode and the second guard PIN diode includes Czochralski silicon having an inherent resistance that exceeds 5 kOhm*cm.

According to an embodiment, the near infrared PIN diode, the first guard PIN diode and the second guard PIN diode include compound semiconductors that have an inherent resistance that exceeds 5 kOhm*cm The volume of a 650 micron thick robust near infrared sensing device bulk is fully depleted when bias voltage of 250 volts is applied to the robust near infrared sensing device with specific resistance of 8 kOhm*cm. The bias voltage may range between 200 to 300 volts.

The bulk of 300 micron thick robust near infrared sensing device is fully depleted when bias voltage of 250 volts is applied to the robust near infrared sensing device with specific resistance of 55 kOhm*cm.

According to an embodiment, the first side edge is coated with antireflective coating.

According to an embodiment, there is provided a method for operating a robust near infrared sensing device, the method includes:

a. Exposing a first side edge of the robust near infrared sensing device to near infrared radiation.
b. Detecting by a near infrared PIN diode of the robust near infrared, the near infrared radiation, while the near infrared diode operated in a fully depletion mode; wherein the near infrared PIN diode is located at a lateral position that corresponds to an absorption depth of an near infrared wavelength; wherein the detecting includes collecting by the near infrared PIN diode, electron-hole pairs generated by the near infrared radiation; and collecting, by guard PIN diodes positioned at different sides of the near infrared PIN diode and while operating in the fully depletion mode, electron-hole pairs generated by the unwanted radiation from any side of different sides of the near infrared PIN diode; and
c. Preventing, by the guard PIN diodes, the electron-hole pairs generated by the unwanted radiation from any side of the different sides of the near infrared PIN diode to reach the near infrared PIN diode, wherein the unwanted radiation includes visible light radiation and ultraviolet radiation.

According to an embodiment, the guard PIN diodes includes (i) a first guard PIN diode that is located at a first lateral distance from the first side edge, the first lateral distance exceeds an absorption depth of the unwanted radiation that enters through the first side edge; and (ii) a second guard PIN diode that is located at a second lateral distance from a second side edge of the robust near infrared sensing device, the second lateral distance exceeds the absorption depth of the unwanted radiation that enters through the second side edge.

According to an embodiment, the first edge corresponds to a cavity formed within the robust near infrared sensing device.

According to an embodiment, the first edge corresponds to a cavity formed within the robust near infrared sensing device.

According to an embodiment, the method includes receiving biasing signals for operating the near infrared PIN diode, the first guard PIN diode and the second guard PIN diode in the fully depletion mode.

FIG. 1 illustrates an example of a cross section of a robust near infrared sensing device 11 that is radially symmetrical and has an inner cavity 17 partially filled with fluid 60 to be evaluated. Ultraviolet radiation 61 that impinges on the fluid causes near infrared radiation 62 (dure to fluorescence) to be detected by the robust near infrared sensing device 11.

FIG. 1 illustrates robust near infrared sensing device 11 as including:

a. Top 13, inner side edge 12 through which the near infrared radiation 62 passes, bottom 15, and external side edge 14.
b. Metal contacts such as first guard PIN diode top contact 53, near infrared PIN diode top contact 52, and second guard PIN diode top contact 51.
c. Combined highly doped n-type and metallization region 22.
d. P-type regions such as first guard PIN diode p-type region 27, near infrared PIN diode top p-type region 25, and second guard PIN diode p-type region 23.
e. N-type region 24.
f. Top oxide region 50 in which the top contacts are formed.

FIG. 1 also illustrates:

a. The collection region 40 of the near infrared PIN diode.
b. The first guard PIN diode 33.
c. The near infrared PIN diode 32.
d. The second guard PIN diode 31.
e. Bottom layer 21. The bottom layer may be transparent to near infrared radiation to receive near infrared radiation from an object 65 located below the robust near infrared sensing device 11.
f. A first distance 71 from the inner side edge 12 that represents a penetration depth that is a largest out of a first penetration depth of visible light and a penetration depth of ultraviolet radiation.
g. A second distance 72 from the inner side edge 12 to a distal edge of the first guard PIN diode 33. The second distance exceeds the first distance. The same distance is provided between the external side edge and a distal edge of the second guard PIN diode 31.
h. A third distance 73 from the inner side edge 12 to a center of the near infrared PIN diode 32.

The second distance should exceed the second distance—to prevent electron hole pairs generated by visible light or ultraviolet radiation from reaching the collection region of the near infrared PIN diode. Nevertheless—the visible light or ultraviolet radiation may reach a collection region the first guard PIN diode and points located at the first distance from the inner side edge may be located within the first guard PIN diode.

Points located at the third distance from the inner side edge may fall on any part of the collection region 40 of the near infrared PIN diode.

Figure 2:
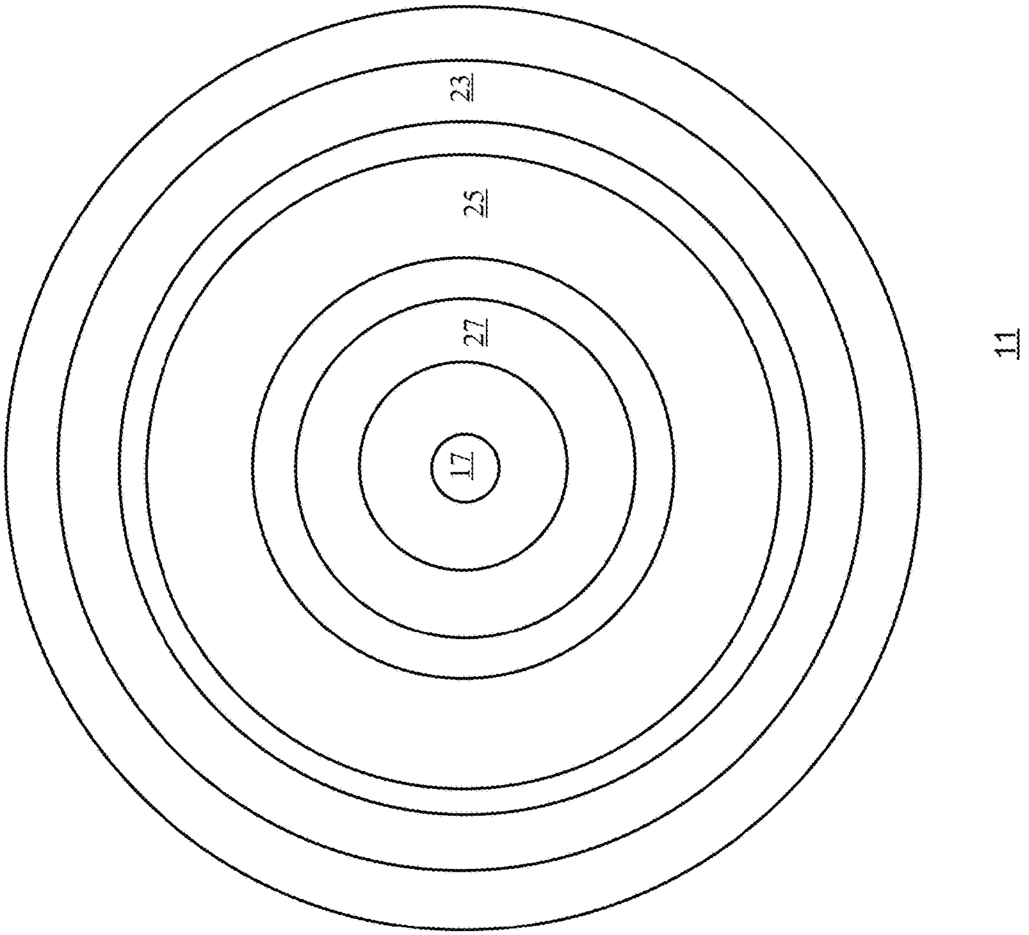
FIG. 2 illustrates an example of a top view of a robust near infrared sensing device.

FIG. 2 illustrates a top view of the robust near infrared sensing device 11. For simplicity of explanation, the top metal contacts and the top oxide region are not shown. FIG. 2 illustrates cavity 17, first guard PIN first guard PIN diode p-type region 27, near infrared PIN diode to p-type region 25, and second guard PIN diode p-type region 23. The first guard PIN diode surrounds the cavity. The near infrared PIN diode surrounds the first guard PIN diode. The second guard PIN diode surrounds the near infrared PIN diode.

Figure 3:
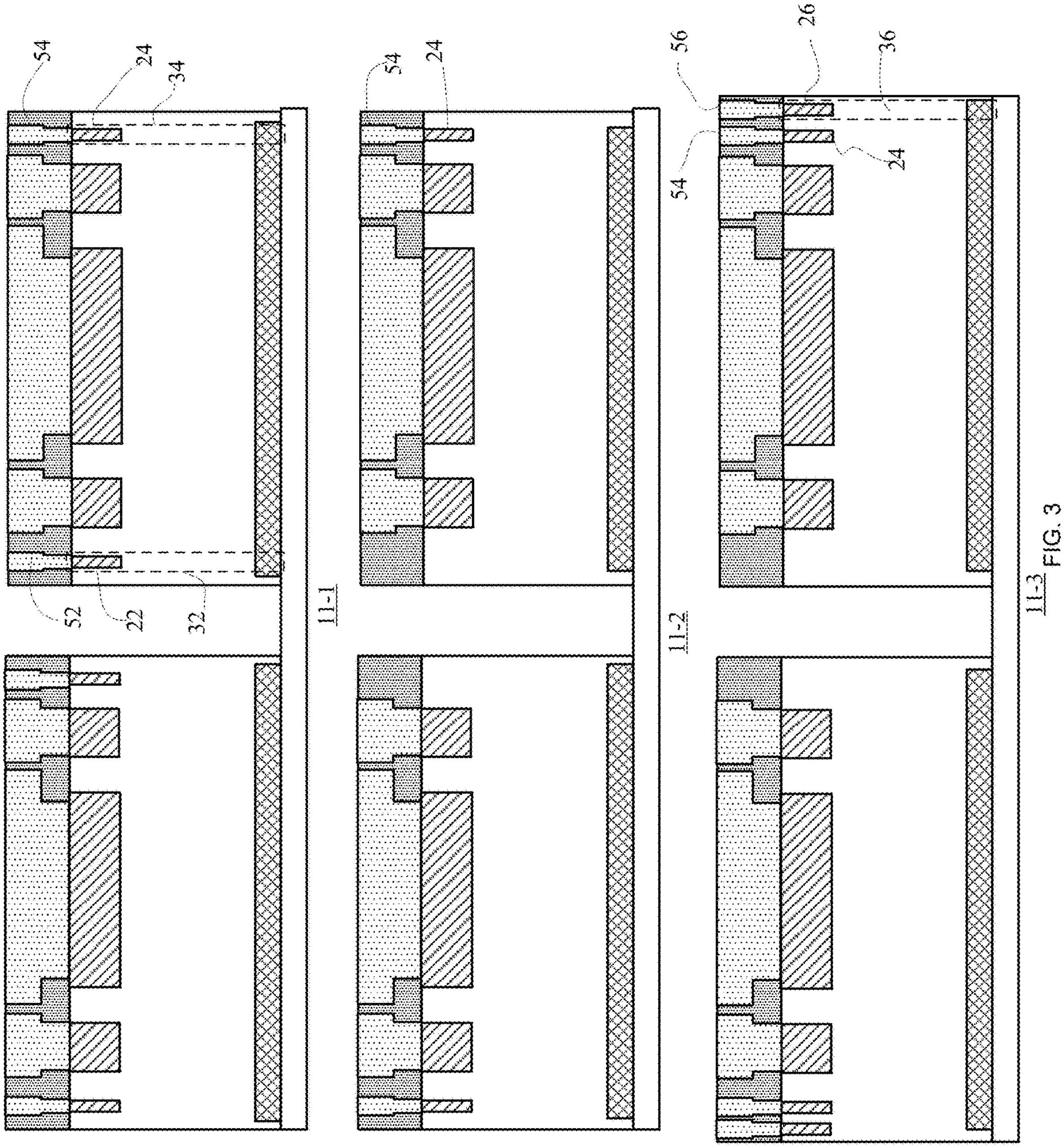
FIG. 3 illustrates examples of cross sections of robust near infrared sensing devices.

FIG. 3 illustrates examples of robust near infrared sensing devices 11-1, 11-2 and 11-3 that differ from the robust near infrared sensing device 11 of FIG. 1 by having one or more floating guard rings for preventing leakages and breakdowns due to potential differences between the multiple PIN diodes and an side edges of the robust near infrared sensing device. The multiple PIN diodes include the first guard PIN diode 33, the near infrared PIN diode 32 and the second guard PIN diode 31.

There may be any number of floating guard rings-one, two or more than two.

A floating guard ring may be positioned between the first guard PIN diode and the inner side edge (see, for example inner floating guard ring 32 having inner floating guard ring p-type region 22 in contact with inner floating guard ring contact 52).

A floating guard ring may be positioned between the second guard PIN diode and the exterior side edge. For example—first exterior floating guard ring 34 having first exterior floating guard ring p-type region 24 in contact with first exterior floating guard ring contact 54. Yet for another example—second exterior floating guard ring 36 having second exterior floating guard ring p-type region 26 in contact with second exterior floating guard ring contact 56.

Figure 4:
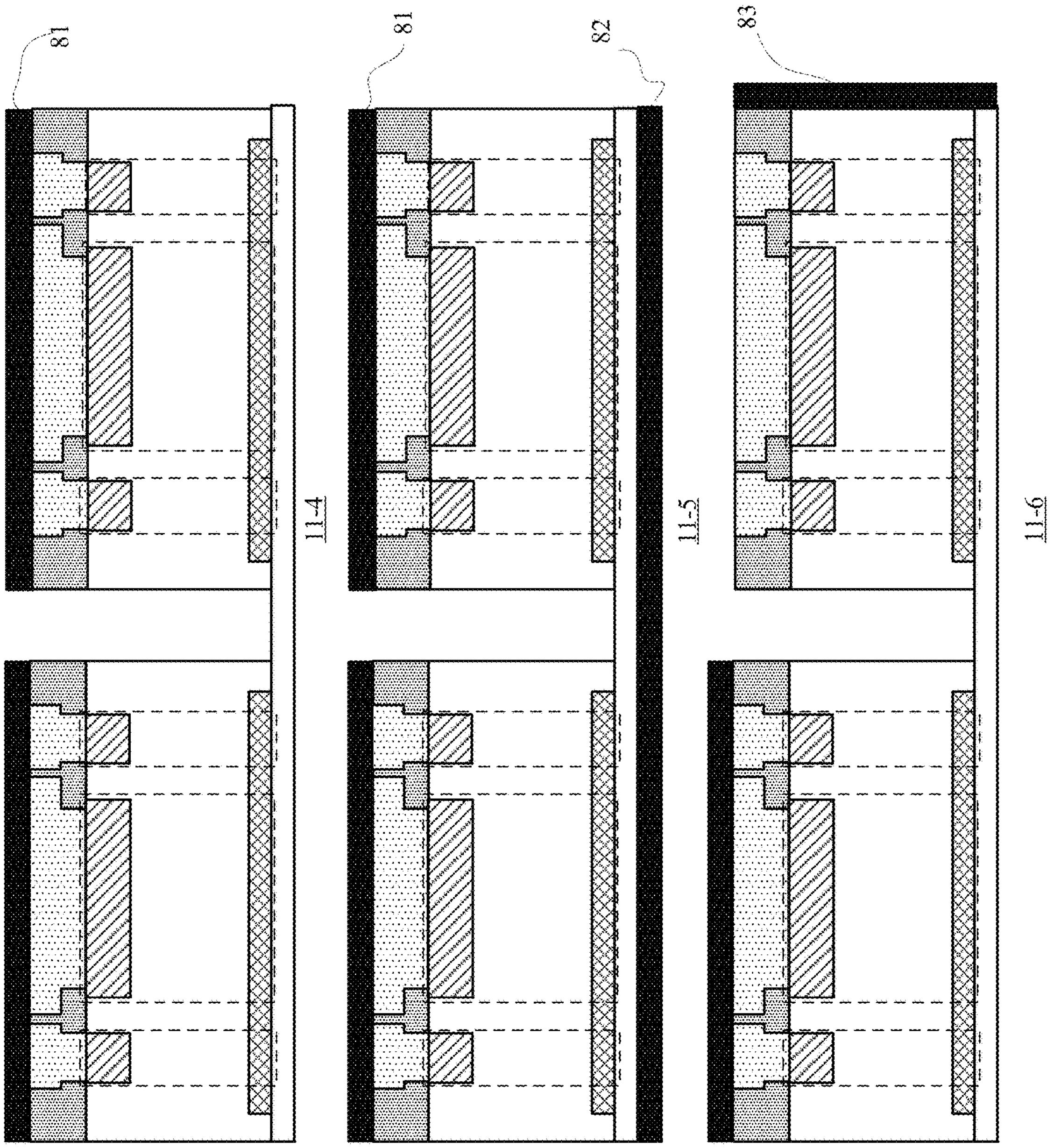
FIG. 4 illustrates examples of cross sections of robust near infrared sensing devices.

FIG. 4 illustrates examples of robust near infrared sensing devices 11-4, 11-5 and 11-6 that differ from the robust near infrared sensing device 11 of FIG. 1 by having one or more unwanted radiation shields configured to block visible radiation and ultraviolet radiation from reaching the near infrared PIN diode. FIG. 4 illustrates top unwanted radiation shield 81, bottom unwanted radiation shield 82 and exterior side edge unwanted radiation shield 83. Any combination of any of the unwanted radiation shields may be provided.

Figure 5:
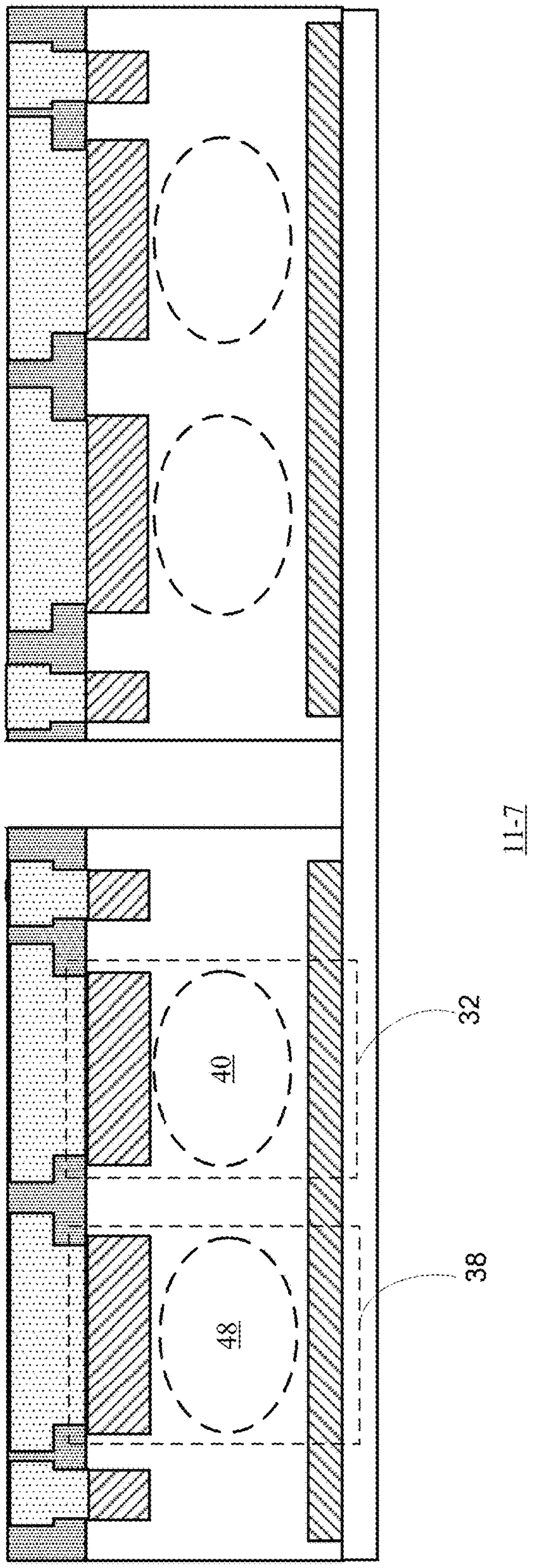
FIG. 5 illustrates an example of a cross section of a robust near infrared sensing device.

FIG. 5 illustrates an example of a robust near infrared sensing device 11-7 that differs from the robust near infrared sensing device 11 of FIG. 1 by having an additional near infrared PIN diode 38 having an additional collection region 48 for collecting near infrared radiation at another wavelength that the near infrared PIN diode 32.

Figure 6:
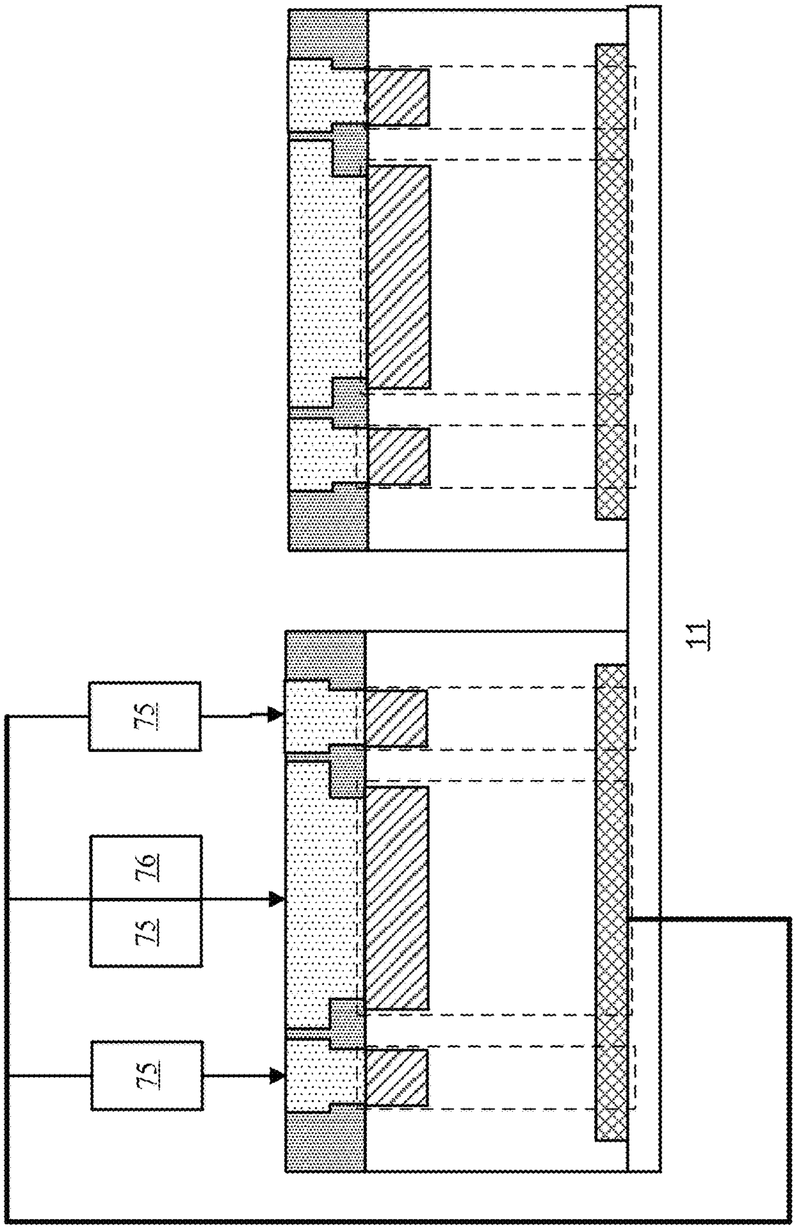
FIG. 6 illustrates an example of a cross section of a robust near infrared sensing device and of biasing and measurement circuits.

FIG. 6 illustrates an example of robust near infrared sensing device 11 as well as biasing circuits 75 and a readout circuits 7. A biasing circuit 75 is provided per each PIN diode of the multiple PIN diodes. The multiple PIN diodes include the first guard PIN diode 33, the near infrared PIN diode 32 and the second guard PIN diode 31.

A readout circuit 76 is provided to the near infrared PIN diode for reading the detection signal (for example current) outputted by the near infrared PIN diode It should be noted that any of the guard PIN diodes may also be coupled to a measurement circuit.

Figure 7:
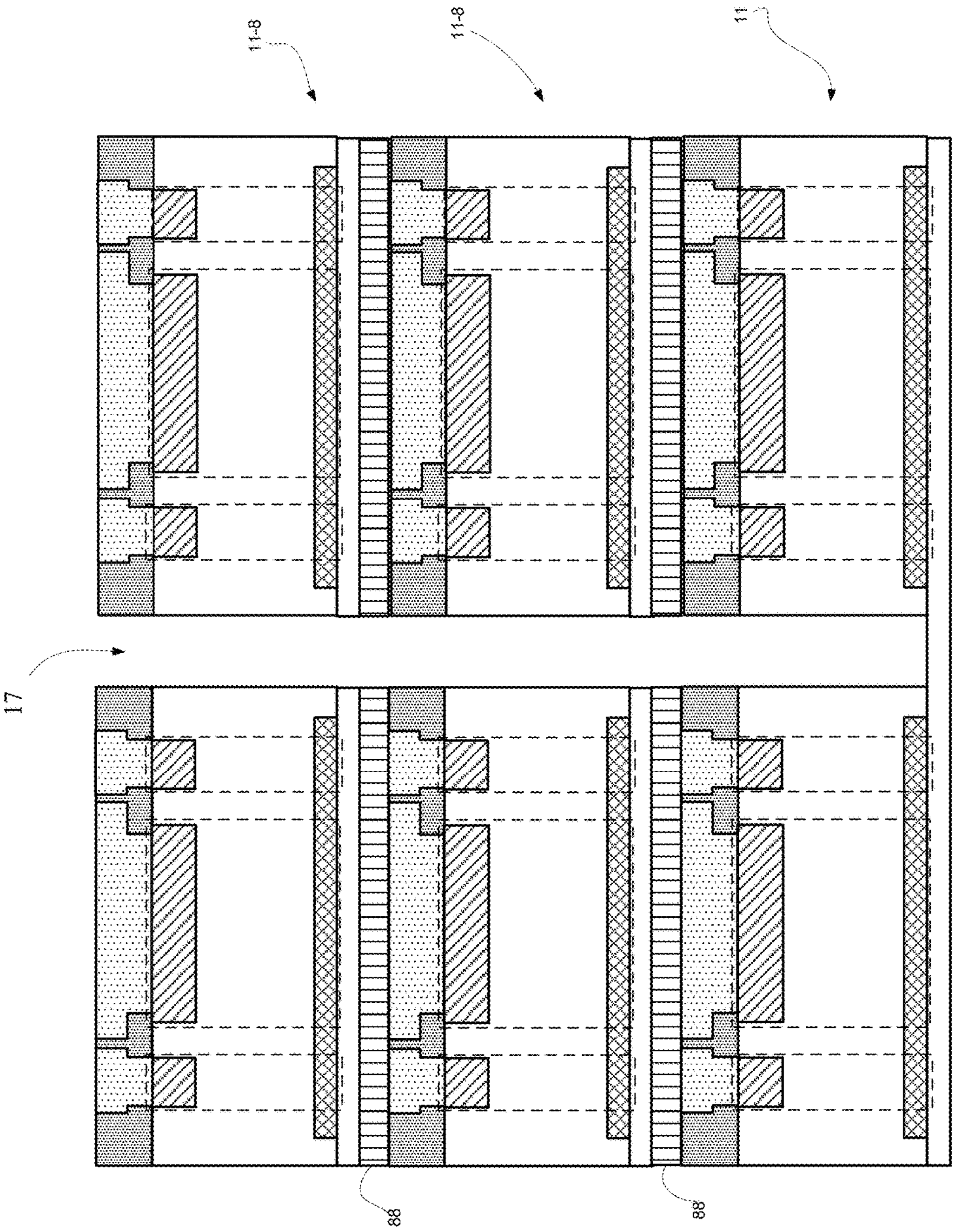
FIG. 7 illustrates an example of a cross section of a stack of a robust near infrared sensing device.

FIG. 7 illustrates an example of a stack of robust near infrared sensing devices. The stack includes the robust near infrared sensing device 11 of FIG. 1 and other robust near infrared sensing device 11-8 that differ from the robust near infrared sensing device 11 by having a bottomless cavity—their bottom does not cover the cavity.

Using multiple robust near infrared sensing devices assists in increasing the signal to noise ratio of the detected signals. For simplicity of explanations one or more biasing circuits for biasing the stack are not shown.

FIG. 7 also illustrates separation layers 88 for isolating one or more bottom metal contacts of one robust near infrared sensing device from top metal contacts of an adjacent robust near infrared sensing device.

According to an embodiment, the robust near infrared sensing device does not include a cavity and may be configured to sense near infrared radiation from its side.

Figure 8:
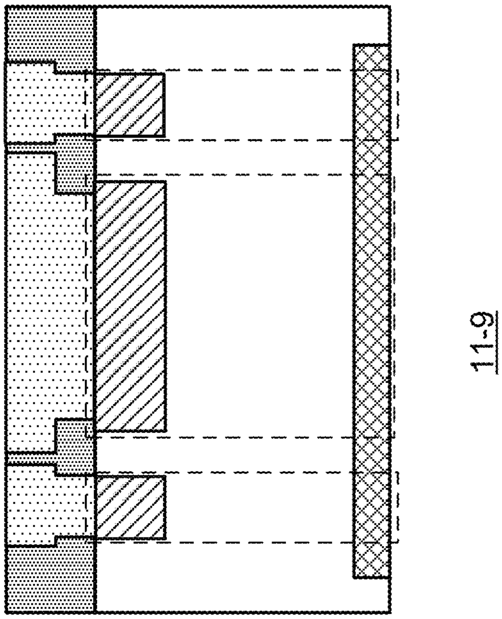
FIG. 8 illustrates an example of a cross section of a robust near infrared sensing device.

FIG. 8 illustrates an example of a robust near infrared sensing device 11-9 that differs from the robust near infrared sensing device 11 of FIG. 1 by not having a cavity.

Figure 9:
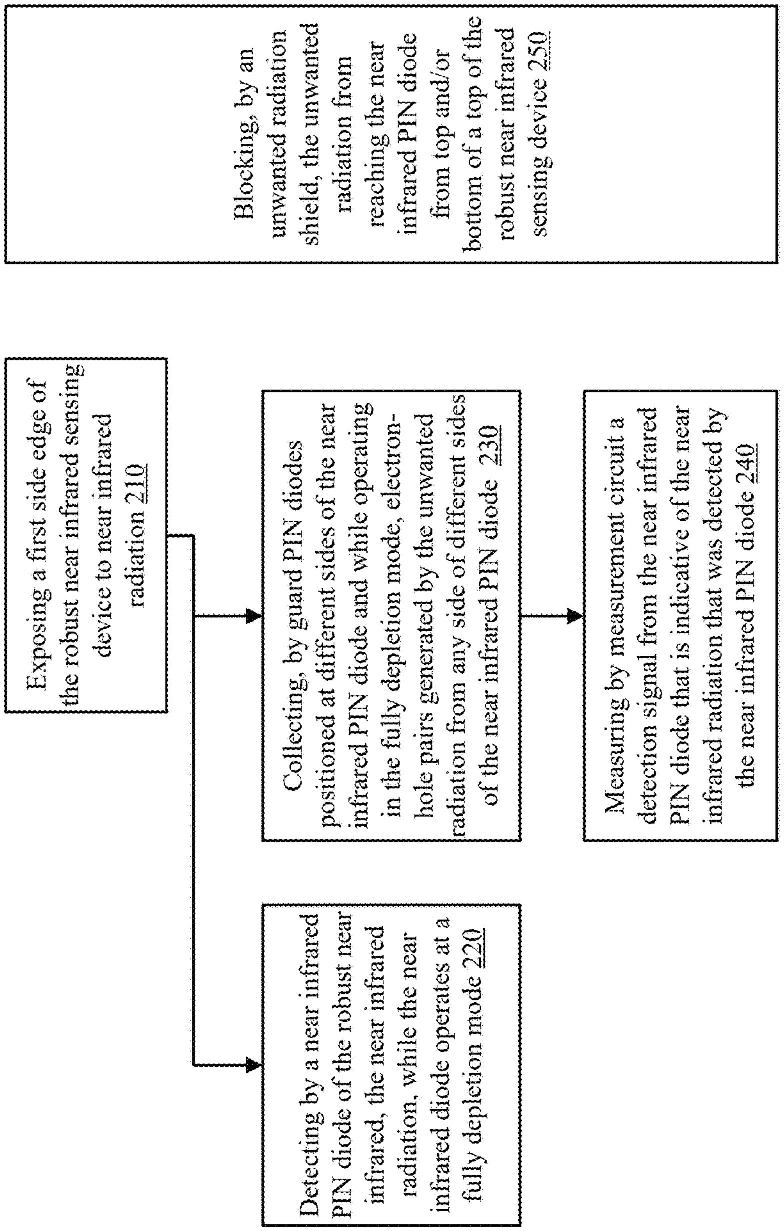
FIG. 9 illustrates an example of a method.

FIG. 9 illustrates an example of method 200 for operating a robust near infrared sensing device.

According to an embodiment, method 200 may start by step 210 exposing a first side edge of the robust near infrared sensing device to near infrared radiation.

According to an embodiment, step 210 is followed by:

a. Step 220 of detecting by a near infrared PIN diode of the robust near infrared, the near infrared radiation, while the near infrared diode operates in a fully depletion mode. The near infrared PIN diode is located at a lateral position that corresponds to an absorption depth of a near infrared wavelength. The detecting includes collecting by the near infrared PIN diode, electron-hole pairs generated by the near infrared radiation.
b. Step 230 of collecting, by guard PIN diodes positioned at different sides of the near infrared PIN diode and while operating in the fully depletion mode, electron-hole pairs generated by the unwanted radiation from any side of different sides of the near infrared PIN diode. The collecting results in preventing, by the by guard PIN diodes, the electron-hole pairs generated by the unwanted radiation from any side of the different sides of the near infrared PIN diode to reach the near infrared PIN diode, wherein the unwanted radiation includes visible light radiation and ultraviolet radiation.

According to an embodiment, step 220 is followed by step 240 of measuring by measurement circuit a detection signal from the near infrared PIN diode that is indicative of the near infrared radiation that was detected by the near infrared PIN diode.

According to an embodiment, method 200 also includes step 250 of blocking, by an unwanted radiation shield, the unwanted radiation from reaching the near infrared PIN diode from at least one of a top of the robust near infrared sensing device a and bottom of the robust near infrared sensing device.

According to an embodiment, method 200 also includes at least one of (i) receiving biasing signals for operating the near infrared PIN diode, the first guard PIN diode and the second guard PIN diode in the fully depletion mode, (ii) biasing the near infrared PIN diode, the first guard PIN diode and the second guard PIN diode for operating the near infrared PIN diode, the first guard PIN diode and the second guard PIN diode in the fully depletion mode.

Figure 10:
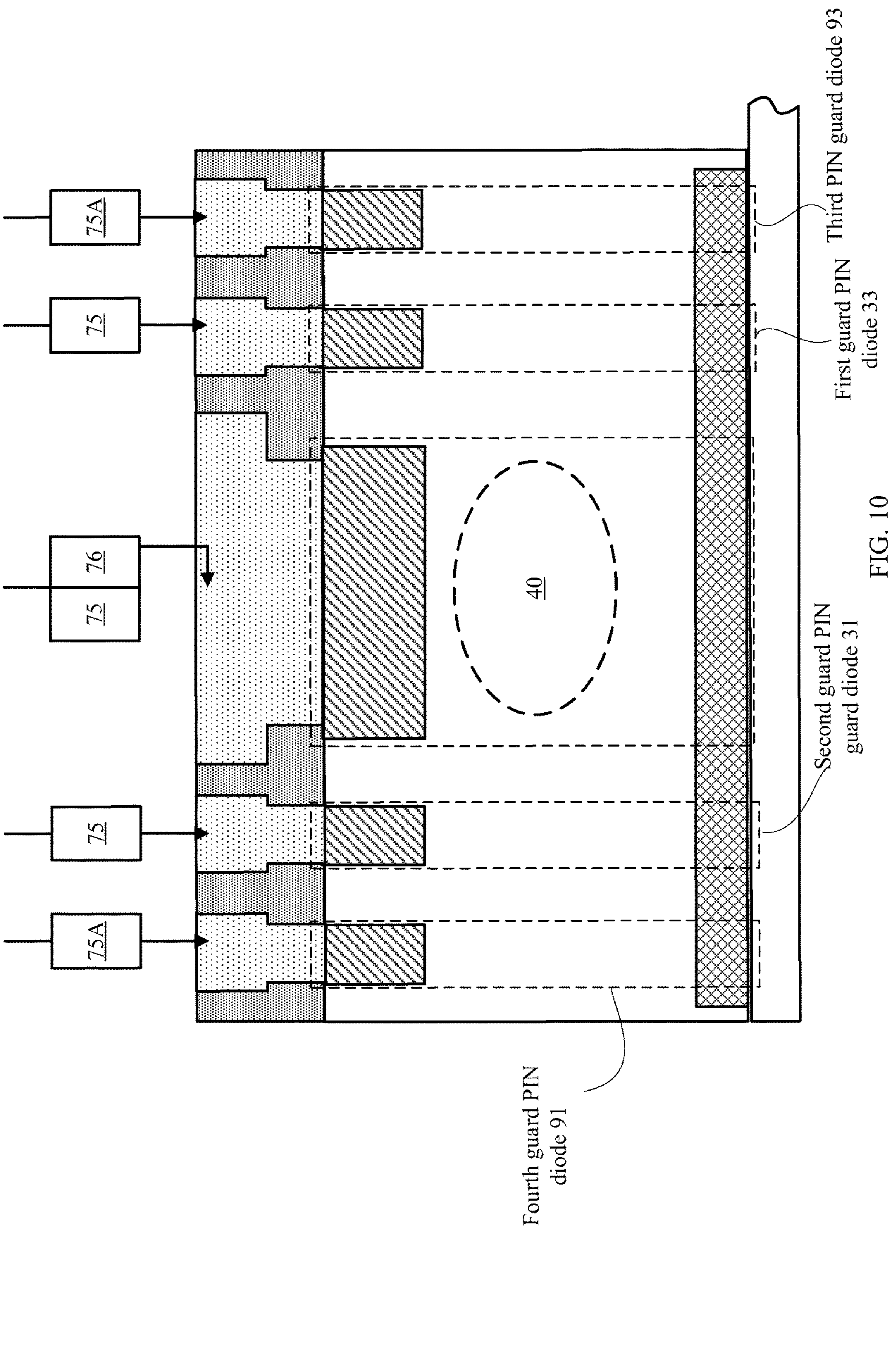
FIG. 10 illustrates an example of a part of a robust near infrared sensing device.

FIG. 10 illustrates an example of a part of a robust near infrared sensing device that further includes a third guard PIN diode 93 and a fourth guard PIN diode 91.

The third guard PIN diode 93 is located between inner side edge 12 and the first guard PIN diode 33. The fourth guard PIN diode 91 is located between exterior side edge 14 and the second guard PIN diode 31.

The third guard PIN diode 93 and a fourth guard PIN diode 91 are operated in a fully depletion mode but also biased by an alternating (AV) voltage for modulating the electron-hole pairs generated by unwanted radiation that enter the robust near infrared sensing device to provide AC modulated electron-hole pairs. The AV voltage amplitude is usually a fraction of the DC bias—for example 5 versus 200-250 volts.

Even when some of the AC modulated electron-hole pairs may reach the near infrared PIN diode 32—despite the presence of the first guard PIN diode 33 and of the second guard PIN diode 31—then the near infrared PIN diode 32 detects these some of the AC modulated electron-hole pairs—but by applying phase detection at a readout circuit or processing circuit located downstream to the near infrared PIN diode 32—these some of the AC modulated electron-hole pairs can be ignored of.

According to an embodiment, the third guard PIN diode 93 and the first guard PIN diode 91 are replaced by a single PIN diode that is DC bias and AC modulated.

In the foregoing detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference to any of the terms "comprise", "comprises", "comprising" "including", "may include" and "includes" may be applied to any of the terms "consists of", "consisting of", "consisting essentially of". For example—any of the rectifying circuits illustrated in any figure may include more components than those illustrated in the figure, only the components illustrated in the figure or substantially only the components illustrated in the figure.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A robust near infrared sensing device, comprising:

an near infrared PIN diode that is located at a lateral position that corresponds to an absorption depth of an near infrared wavelength; wherein the near infrared PIN diode, once operated in a fully depletion mode, is configured to collect electron-hole pairs generated by near infrared radiation of the near infrared wavelength that passes through a first side edge of the robust near infrared sensing device and having an absorption depth that corresponds to a lateral position of the near infrared PIN diode; and a first guard PIN diode that is located at a first lateral distance from the first side edge, the first lateral distance exceeds an absorption depth of a first unwanted radiation that enters through the first side edge; wherein once operated in the fully depletion mode, the first guard PIN diode is configured to collect first electron-hole pairs generated by the first unwanted radiation, and to prevent the first electron-hole pairs to reach the near infrared PIN diode; wherein the first unwanted radiation is at least one of first visible light radiation and first ultraviolet radiation;

a second guard PIN diode that is located at a second lateral distance from a second side edge of the robust near infrared sensing device, the second lateral distance exceeds an absorption depth of a second unwanted radiation that enters through the second side edge; wherein once operated in the fully depletion mode, the second guard PIN diode is configured to collect second electron-hole pairs generated by the second unwanted radiation, and to prevent the second electron-hole pairs to reach the near infrared PIN diode; wherein the second unwanted radiation is at least one of second visible light radiation and second ultraviolet radiation.

2. The robust near infrared sensing device according to claim 1, wherein the first edge corresponds to a cavity formed within the robust near infrared sensing device.

3. The robust near infrared sensing device according to claim 2, wherein the first guard PIN diode surrounds the cavity, the near infrared PIN diode surrounds the first guard PIN diode, and the second guard PIN diode surrounds the near infrared PIN diode.

4. The robust near infrared sensing device according to claim 3, wherein the first guard PIN diode, the near infrared PIN diode and the second guard PIN diode are annular.

5. The robust near infrared sensing device according to claim 1, wherein one or more dimensions of the robust near infrared sensing device are in an order of an absorption length of the first unwanted radiation.

6. The robust near infrared sensing device according to claim 1, comprising an unwanted radiation shield configured to block visible radiation and ultraviolet radiation from reaching the near infrared PIN diode from a top and bottom of the robust near infrared sensing device.

7. The robust near infrared sensing device according to claim 6, comprising a continuous metal contact at a bottom of the robust near infrared sensing device.

8. The robust near infrared sensing device according to claim 1 further comprises contacts for receiving biasing signals for operating the near infrared PIN diode, the first guard PIN diode and the second guard PIN diode in the fully depletion mode.

9. The robust near infrared sensing device according to claim 8 further comprising a biasing circuit that is in electrical communication with the contacts and is configured to provide biasing signals for operating the near infrared PIN diode, the first guard PIN diode and the second guard PIN diode in the fully depletion mode.

10. The robust near infrared sensing device according to claim 1, wherein the near infrared PIN diode, the first guard PIN diode and the second guard PIN diode comprises Float Zone silicon.

11. The robust near infrared sensing device according to claim 1, wherein the near infrared PIN diode, the first guard PIN diode and the second guard PIN diode comprises Czochralski silicon having an inherent resistance that exceeds 5 kOhm*cm.

12. The robust near infrared sensing device according to claim 1, wherein the near infrared PIN diode, the first guard PIN diode and the second guard PIN diode comprise compound semiconductors that have an inherent resistance that exceeds 5 kOhm*cm.

13. The robust near infrared sensing device according to claim 1, wherein the first side edge is coated with antireflective coating.

14. The robust near infrared sensing device according to claim 1, comprising an additional PIN diode configured to modulate electron-hole pairs generated by unwanted radiation from a side of the near infrared PIN diode.

15. A method for operating a robust near infrared sensing device, the method comprising:

exposing a first side edge of the robust near infrared sensing device to near infrared radiation;

detecting by a near infrared PIN diode of the robust near infrared, the near infrared radiation, while the near infrared diode operated at a fully depletion mode; wherein the near infrared PIN diode is located at a lateral position that corresponds to an absorption depth of an near infrared wavelength; wherein the detecting comprises collecting by the near infrared PIN diode, electron-hole pairs generated by the near infrared radiation;

collecting, by guard PIN diodes positioned at different sides of the near infrared PIN diode and while operating in the fully depletion mode, electron-hole pairs generated by unwanted radiation from any side of different sides of the near infrared PIN diode; and preventing, by the by guard PIN diodes, the electron-hole pairs generated by the unwanted radiation from any side of the different sides of the near infrared PIN diode to reach the near infrared PIN diode, wherein the unwanted radiation comprises visible light radiation and ultraviolet radiation.

16. The method according to claim 15, wherein the guard PIN diodes comprise (i) a first guard PIN diode that is located at a first lateral distance from the first side edge, the first lateral distance exceeds an absorption depth of the unwanted radiation that enters through the first side edge; and (ii) a second guard PIN diode that is located at a second lateral distance from a second side edge of the robust near infrared sensing device, the second lateral distance exceeds the absorption depth of the unwanted radiation that enters through the second side edge.

17. The method according to claim 16, wherein the first edge corresponds to a cavity formed within the robust near infrared sensing device.

18. The method according to claim 16, wherein the second edge corresponds to an exterior of the robust near infrared sensing device.

19. The method according to claim 16 further comprising receiving biasing signals for operating the near infrared PIN diode, the first guard PIN diode and the second guard PIN diode in the fully depletion mode.

20. The method according to claim 14, further comprising modulating an additional guard PIN diode by alternating current (AC) modulation for AC modulating unwanted radiation from reaching the near infrared PIN diode from at least one side of the robust near infrared sensing device.

* * * * *